(12) United States Patent
Stirk

(10) Patent No.: US 9,680,471 B2
(45) Date of Patent: Jun. 13, 2017

(54) APPARATUS FOR A REDUCED CURRENT WAKE-UP CIRCUIT FOR A BATTERY MANAGEMENT SYSTEM

(71) Applicant: Apple Inc., Cupertino, CA (US)

(72) Inventor: Gary L. Stirk, West Melbourne, FL (US)

(73) Assignee: Apple Inc., Cupertino, CA (US)

( * ) Notice: Subject to any disclaimer, the term of this patent is extended or adjusted under 35 U.S.C. 154(b) by 120 days.

(21) Appl. No.: 14/705,553

(22) Filed: May 6, 2015

(65) Prior Publication Data

US 2016/0181846 A1 Jun. 23, 2016

Related U.S. Application Data

(60) Provisional application No. 62/096,323, filed on Dec. 23, 2014.

(51) Int. Cl.
*H02J 7/00* (2006.01)
*H03K 19/0175* (2006.01)
(Continued)

(52) U.S. Cl.
CPC . *H03K 19/017509* (2013.01); *G01R 31/3655* (2013.01); *G01R 31/3675* (2013.01); *H02J 7/007* (2013.01); *H02J 7/0026* (2013.01); *H02J 7/0052* (2013.01); *H02J 7/0068* (2013.01); *H03L 7/00* (2013.01); *G06F 13/4256* (2013.01);
(Continued)

(58) Field of Classification Search
CPC ............ H03K 19/017509; H02J 7/0026; H02J 7/0068; H02J 7/0052; H02J 7/007; H02J 7/0021; H02J 2007/0059; H03L 7/00; G01R 31/3655; G01R 31/3675; G06F 13/4256

See application file for complete search history.

(56) References Cited

U.S. PATENT DOCUMENTS 4,316,106 A   2/1982   Young
5,760,725 A   6/1998   Yoshida
(Continued)

FOREIGN PATENT DOCUMENTS

DE   102013100799   6/2014
EP   2485293        8/2012

OTHER PUBLICATIONS

International Search Report and Written Opinion in application No. PCT/US2015/055405 issued Jan. 28, 2016.
(Continued)

*Primary Examiner* — Nha Nguyen
(74) *Attorney, Agent, or Firm* — Meyertons, Hood, Kivlin, Kowert & Goetzel, P.C.

(57) ABSTRACT

An apparatus may include an energy monitoring circuit configured to generate a bitstream dependent upon an amount of charge passing through a sensing unit. The apparatus may also include a control unit configured to receive the bitstream from the energy monitoring circuit, and modify a count value in response to a determined state of each bit of the bitstream. The control unit may also read a first value of the count value at a first time and at a later second time read a second value of the count value. The control unit may assert a wake-up signal in response to a determination that a difference between the first value and the second value is greater than a predetermined threshold value.

20 Claims, 5 Drawing Sheets

(51) Int. Cl.
*G01R 31/36* (2006.01)
*H03L 7/00* (2006.01)
*G06F 13/42* (2006.01)

(52) U.S. Cl.
CPC ..... *H02J 7/0021* (2013.01); *H02J 2007/0059* (2013.01); *Y02B 60/1228* (2013.01); *Y02B 60/1235* (2013.01)

(56) References Cited

U.S. PATENT DOCUMENTS

| | | |
|---|---|---|
| 6,421,270 B1 | 7/2002 | Tai |
| 6,636,087 B2 | 10/2003 | Miyazaki |
| 8,102,211 B2 | 1/2012 | Shi |
| 8,139,953 B2 | 3/2012 | Okayasu |
| 2008/0091362 A1 | 4/2008 | Tae |
| 2013/0275067 A1 | 10/2013 | Mikuteit et al. |
| 2014/0125274 A1 | 5/2014 | Kim |
| 2014/0184314 A1 | 7/2014 | Takahashi et al. |
| 2014/0218011 A1* | 8/2014 | Nabhane ............ G05F 1/625 324/113 |
| 2014/0278168 A1 | 9/2014 | Rogers |
| 2015/0032394 A1 | 1/2015 | Kimura et al. |

OTHER PUBLICATIONS

Office Action and Search Report in ROC (Taiwan) Patent Application No. 104135645 issued Oct. 4, 2016.

* cited by examiner

US 9,680,471 B2

APPARATUS FOR A REDUCED CURRENT WAKE-UP CIRCUIT FOR A BATTERY MANAGEMENT SYSTEM

PRIORITY CLAIM

The present application claims benefit of priority to U.S. Provisional Application No. 62/096,323, filed on Dec. 23, 2014, which is hereby incorporated by reference in its entirety as though fully and completely set forth herein. In the event any statements seemingly conflict, then the statements disclosed in the present application supersede the conflicting statements disclosed in U.S. Provisional Application No. 62/096,323.

BACKGROUND

Technical Field

Embodiments described herein are related to the field of integrated circuits, and more particularly to the implementation of energy monitoring circuits.

Description of the Related Art

Computing systems may include one or more systems-on-a-chip (SoCs), which may integrate a number of different functions, such as, application execution, graphics processing and audio processing, onto a single integrated circuit. With numerous functions included in a single integrated circuit, chip count may be kept low in mobile computing systems, such as tablets, for example, which may result in reduced assembly costs, and a smaller form factor for such mobile computing systems.

Various computing systems may include one or more power sources, such as batteries for example, for supplying power to some or all of the system. For various reasons, a current provided by one or more of the power sources (i.e., a supply current) may be monitored within the system. Supply currents may be monitored, for example, to track and compare power consumed by one or more portions of the computing system, to estimate a remaining power available from the power source, or to profile energy usage over time. A battery management circuit (BMC) or other type of integrated circuit (IC) may be used to monitor supply currents. During times when the computing system is inactive and not consuming significant power, the BMC may be placed in a reduced power mode. However, in some embodiments, the BMC may not enter a reduced power mode unless it can respond quickly when the computing system moves into an active state. This restriction may prevent use of some reduced power modes in such embodiments. Alternatively, accuracy may be lost if the BMC is placed in a reduced power mode as the computing system may begin consuming non-trivial amounts of power from the battery before the BMC is able to return to an operating state capable of monitoring the increased power consumption.

SUMMARY OF THE EMBODIMENTS

Various embodiments of an energy monitoring circuit are disclosed. Broadly speaking, a system, an apparatus, and a method are contemplated in which the apparatus may include an energy monitoring circuit configured to generate a bitstream dependent upon an amount of charge passing through a sensing unit. The apparatus may also include a control unit configured to receive the bitstream from the energy monitoring circuit and modify a count value in response to a determined state of each bit of the bitstream. The control unit may also read a first value of the count value at a first time and read a second value of the count value at a second time, occurring after a predetermined amount of time has elapsed since the first time. The control unit may further assert a wake-up signal in response to a determination that a difference between the first value and the second value is greater than a predetermined threshold value.

In a further embodiment, to generate the bitstream, the energy monitoring circuit may be further configured to measure a voltage level between a first terminal of the sensing unit and a second terminal of the sensing unit, and to generate a sense current, wherein a value of the sense current is dependent upon the voltage level. In another embodiment, the energy monitoring circuit may be further configured to charge a capacitive element dependent upon the sense current and one or more reference currents.

In an embodiment, to generate the bitstream, the energy monitoring circuit may be further configured to compare a voltage level between terminals of the capacitive element to a reference voltage level. In another embodiment, to adjust the count value, the control unit may be further configured to increment the count value in response to a determination that a given bit of the bitstream is in a logic high state.

In a further embodiment, to modify the count value, the control unit is further configured to decrement the count value in response to a determination that the given bit of the bitstream is in a logic low state. In one embodiment, the predetermined threshold value is programmable.

BRIEF DESCRIPTION OF THE DRAWINGS

The following detailed description makes reference to the accompanying drawings, which are now briefly described.

Figure 1:
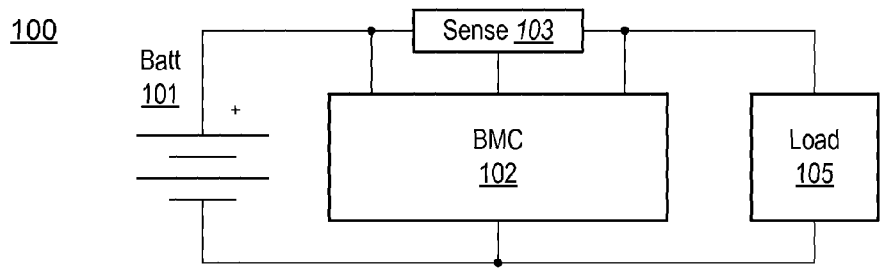
FIG. 1 illustrates an embodiment of a battery management system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

Portable devices may utilize one or more battery cells for providing power to the circuits of the device. Each battery cell includes a positive and negative terminal capable of providing voltage and current to one or more of the circuits. In some devices, battery monitoring circuits may be used to monitor and manage the performance of the battery cells. Some such devices may use a single monitoring circuit to manage all battery cells while other devices may use one monitoring circuit for each battery cell. In cases in which multiple battery monitoring circuits are used, each circuit may receive power only from the battery cell it is monitoring. Providing a dedicated monitoring circuit to each battery cell may provide advantages such as allowing the circuit to be placed adjacent to or even within a package of the cell.

Current supplied from one or more battery cells within a portable device may be monitored by a battery management circuit coupled to a respective battery cell. A common method for measuring current includes placing a resistor in series with a supply line from a battery cell. At times when the portable device may be inactive, management of the battery may involve fewer tasks. This may allow for portions of the battery management circuit to shut down or enter reduced power modes, thereby further reducing power consumption from the battery. The portions shutting down or otherwise entering reduced power modes may be reactivated upon detection of increased activity in the portable device. A method for detecting the increased activity early may provide advantages to the battery monitoring circuit.

In some embodiments, to detect increased system activity, some systems may use an analog comparator to monitor a current sensing device (e.g., resistor). The analog comparator may be used to detect when a voltage level of the current sensing device increases to a predetermined level and then asserts a wake-up signal. Using analog comparators in such a system, however, may present several issues. For example, the analog comparator may not be capable of filtering out offset errors caused by, for example, temperature changes that impact leakage currents present in the reduced power mode. Additionally, setting the predetermined voltage level to an acceptable level of accuracy may be difficult, particularly when designing a system to detect small current increases that may be necessary to assert the wake-up signal for the battery management circuit to respond early enough to track the increasing current.

Embodiments of circuits are disclosed herein which may allow for monitoring a level of current flowing while at least a portion of a battery management system is in a reduced power mode. The disclosed embodiments may also assert a wake-up signal in response to an increase in the flow of energy being monitored.

It is noted that, although battery monitoring circuits are used herein to demonstrate the disclosed concepts, these concepts may apply to other types of circuits as well. For example, the concepts may apply to an electricity utility meter.

Many terms commonly used in reference to IC designs are used in this disclosure. For the sake of clarity, the intended definitions of some of these terms, unless stated otherwise, are as follows.

A Metal-Oxide-Semiconductor Field-Effect Transistor (MOSFET) describes a type of transistor that may be used in modern digital logic designs. MOSFETs are designed as one of two basic types, n-channel and p-channel. N-channel MOSFETs open a conductive path between the source and drain when a positive voltage greater than the transistor's threshold voltage is applied between the gate and the source. P-channel MOSFETs open a conductive path when a voltage greater than the transistor's threshold voltage is applied between the drain and the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an re-channel transistor on, i.e., opens a conductive path, and turns a p-channel MOSFET off, i.e., closes a conductive path. Conversely, a low level on the gate of a MOSFET turns a p-channel on and an n-channel off. While CMOS logic is used in the examples described herein, it is noted that any suitable logic process may be used for the circuits described in embodiments described herein.

It is noted that "logic 1", "high", "high state", or "high level" refers to a voltage sufficiently large to turn on a n-channel MOSFET and turn off a p-channel MOSFET, while "logic 0", "low", "low state", or "low level" refers to a voltage that is sufficiently small enough to do the opposite. In other embodiments, different technology may result in different voltage levels for "low" and "high."

The embodiments illustrated and described herein may employ CMOS circuits. In various other embodiments, however, other suitable technologies may be employed.

A block diagram of a system including a battery and battery monitoring circuit is shown in FIG. 1. System 100 includes battery (batt) 101, battery monitoring circuit (BMC) 102, sensor element (sense) 103, and load 105. System 100 may correspond to a portable computing system, or a portion thereof, such as a laptop computer, smartphone, tablet or wearable device.

Battery 101 may be a single battery cell or a plurality of battery cells coupled together to produce a single output voltage. In various embodiments, battery 101 may be rechargeable or disposable. In the present embodiment, battery 101 provides power to load 105 and to BMC 102.

BMC 102 manages the performance of battery 101 by measuring and tracking current supplied by battery 101 to load 105. If battery 101 is rechargeable, BMC may also measure and track a recharging current into battery 101. BMC 102 may maintain operational or statistical information regarding battery 101 such as, for example, an amount of charge (i.e., a number of coulombs) used/remaining, an average current supplied, a peak current supplied, a number of charging cycles battery 101 has undergone, and an elapsed time for a current charging cycle. BMC 102 may be communicatively coupled to a processor in system 100 (not shown) to receive commands from the processor and to provide the maintained battery information to the processor.

BMC 102 measures current using sensor element 103. Sensor element 103 may include a resistor, transistor, and/or other component or circuit capable of sensing a direction and amount of current flowing in a supply line from battery 101 to load 105. Sensor element may also include a transistor or other switching device to enable and disable a flow of current from battery 101 to load 105. In some embodiments, a same transistor may be used for enabling the current as well as measuring the current. To sense a level of current, BMC 102 may measure a voltage on either side of sensor element 103 and convert the voltage measurements to a corresponding magnitude and direction of current.

Load 105 represents any circuit or circuits receiving power from battery 101. In various embodiments, load 105 may be a single IC, a complete portable computing device, or a portion of a computing device. Load 105, may, in embodiments in which battery 105 is rechargeable, include circuits for relaying a recharging current to battery 101.

The portable device may enter an inactive mode at various times. During this inactive mode, current from the battery may be lower than during an active mode. BMC 102 may have fewer tasks to perform as a result, and may therefore be able to enter a reduced power mode by placing various circuits into shutdown or stand-by modes. Monitoring the current through sensor element 103 remains active, however, and BMC 102 includes circuits for asserting an indication of increased current flow. This indication may be used to wake the circuits in the reduced power mode as described below. While the current continues to be monitored in the reduced power mode, BMC 102 may stop tracking an accumulation of the charge flowing from battery 101.

In order to respond to the increased current flow quickly and begin to track the increased charge flowing from battery 101, the indication of increased current may be set to assert upon detecting a small increase in current, thereby allowing BMC 102 to respond quickly and track of the flowing charge. In other words, the earlier BMC 102 begins tracking charge, the more charge BMC 102 will track. This may result in a more accurate tracking of the remaining charge in battery 101. If, however, the indication is set to assert upon detecting too small of an increased current, then BMC 102 may be awoken due to background noise in the system rather than an actual increase in system activity. This may result in wasted power consumption by BMC 102.

It is noted that system 100 of FIG. 1 is merely an example. Other embodiments may include more components. For example, BMC 102 may measure more than one sensor element in order to monitor multiple power supply lines from battery 101 to multiple loads.

Figure 2:
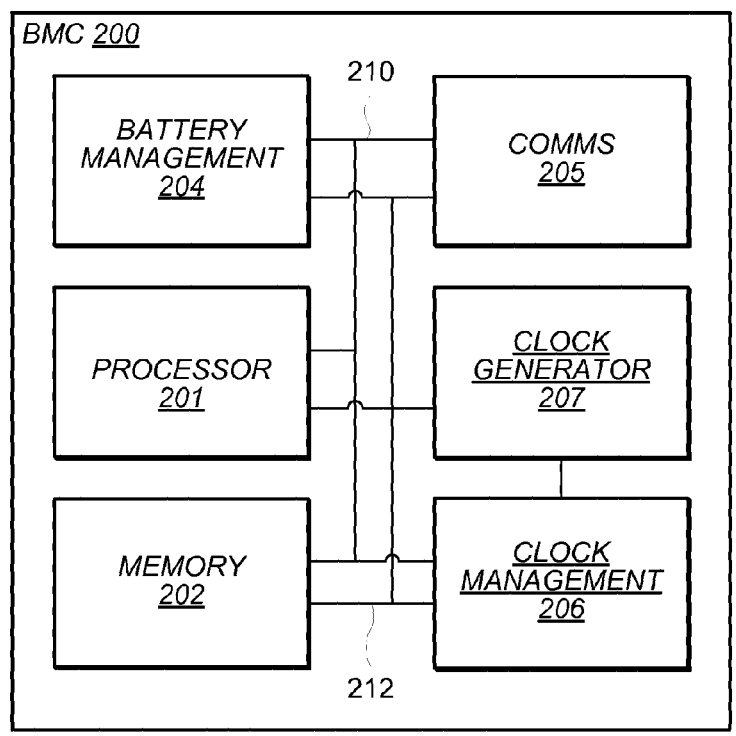
FIG. 2 illustrates an embodiment of a block diagram of a battery management circuit.

Moving to FIG. 2, a block diagram of an embodiment of an battery management circuit (BMC) is illustrated. In some embodiments, BMC 200 corresponds to BMC 102 in FIG. 1. In the illustrated embodiment, BMC 200 includes processor 201 coupled to memory block 202, battery management unit 204, communication block 205, clock management unit 206, all coupled through bus 210. Additionally, clock generator 207 may be coupled to clock management unit 206 and provide one or more clock signals 212 to the functional blocks in BMC 200.

Processor 201 may, in various embodiments, be representative of a general-purpose processor that performs computational operations. For example, processor 201 may be a central processing unit (CPU) such as am embedded processor, a microcontroller, an application-specific integrated circuit (ASIC), or a field-programmable gate array (FPGA). In some embodiments, processor 201 may include multiple CPU cores and may include one or more register files and memories.

In various embodiments, processor 201 may implement any suitable instruction set architecture (ISA), such as, e.g., ARM Cortex or x86 ISAs, or combination thereof. Processor 201 may include one or more bus transceiver units that allow processor 201 to communicate to other functional blocks via bus 210, such as, memory block 202, for example.

Memory block 202 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM). Some embodiments may include a single memory, such as memory block 202 and other embodiments may include more than two memory blocks (not shown). In various embodiments, memory block 202 may be configured to store program instructions that may be executed by processor 201, store data to be processed, such as graphics data, or a combination thereof.

Battery management unit 204 includes circuits to manage the performance of a battery coupled to BMC 200. Battery management unit 204 may include one or more analog-to-digital converters (ADCs) for measuring voltage levels of sensors, such as, e.g., sensor element 103 in FIG. 1. Battery management unit 204 may include additional circuits for measuring temperature, measuring charge/coulombs, and controlling charging of the coupled battery. Circuits for determining an increase in current flow are included and may be used to assert a signal to wake up functional blocks within BMC 200 that are in reduced power modes.

Communication block 205 includes circuits for communicating with other ICs. Communication block may include circuits for supporting multiple communication protocols, such as, for example, inter-integrated circuit (I²C), universal asynchronous receiver/transmitter (UART), and serial peripheral interface (SPI). In addition, communication block 205 includes support for a communication protocol that enables signals to be transmitted and received across two or more voltage domains. The additional protocol may provide communication support between two or more BMCs, each coupled to and powered by separate batteries.

Clock management unit 206 may be configured to enable, configure and monitor outputs of one or more clock sources. In various embodiments, the clock sources may be located in clock generator 207, communication block 205, within clock management unit 206, in other blocks within BMC 200, or come from an external signal coupled through one or more input/output (I/O) pins. In some embodiments, clock management 206 may be capable of configuring a selected clock source before it is distributed throughout BMC 200. Clock management unit 206 may include circuits for synchronizing an internal clock source to an external clock signal.

Clock generator 207 may be a separate module within BMC 200 or may be a sub-module of clock management unit 206. One or more clock sources may be included in clock generator 207. In some embodiments, clock generator 207 may include PLLs, FLLs, DLLs, internal oscillators, oscillator circuits for external crystals, etc. One or more clock signal outputs 212 may provide clock signals to various functional blocks of BMC 200.

System bus 210 may be configured as one or more buses to couple processor 201 to the other functional blocks within the BMC 200 such as, e.g., memory block 202, and I/O block 203. In some embodiments, system bus 210 may include interfaces coupled to one or more of the functional blocks that allow a particular functional block to communicate through the bus. In some embodiments, system bus 210 may allow movement of data and transactions (i.e., requests and responses) between functional blocks without intervention from processor 201. For example, data received through the I/O block 203 may be stored directly to memory block 202.

When included in a system such as system 100 of FIG. 1, BMC 200 may place one or more functional blocks into a reduced powered mode during times when system 100 is inactive. For example, processor 201, communications block 205, memory 202, and clock management 206 may be placed into respective reduced power modes when system 100 is inactive. At least portions of battery management unit 204, however, may remain active to continue to track an amount of coulombs flowing from battery 101. Additionally, a clock signal from clock generator 207 may also remain active to provide a clock signal to battery management unit 204.

It is noted that the BMC illustrated in FIG. 2 is merely an example. In other embodiments, different functional blocks and different configurations of functions blocks may be possible dependent upon the specific application for which the BMC is intended.

Figure 3:
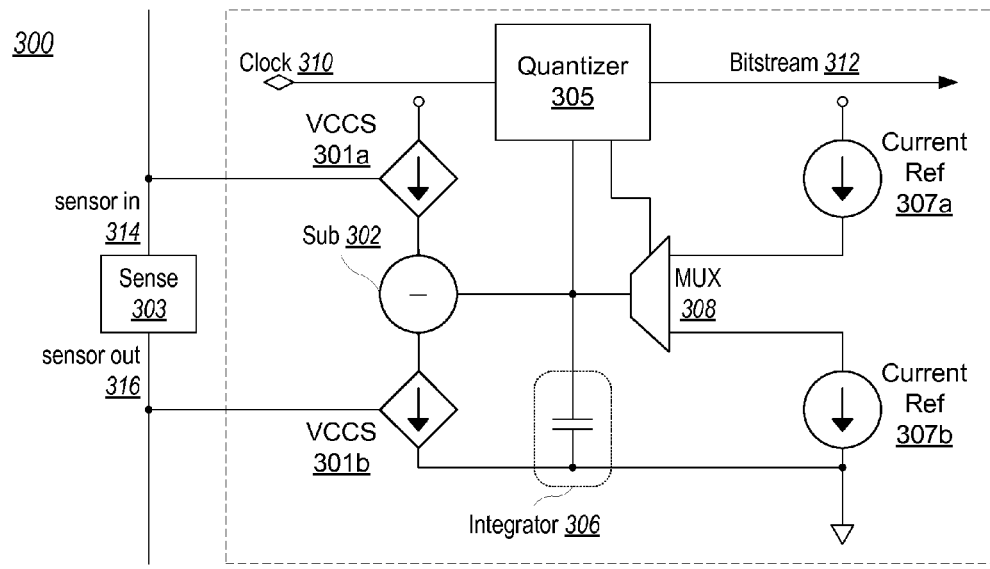
FIG. 3 shows a block diagram for an embodiment of a charge monitoring circuit.

Turning to FIG. 3, a block diagram for an embodiment of a charge monitoring circuit 300 is illustrated. Charge monitoring circuit 300 may correspond to a circuit in battery management unit 204 in BMC 200 of FIG. 2. The illustrated embodiment of charge monitoring circuit 300 includes two voltage-controlled current sources, VCCS 301a and VCCS 301b coupled to current subtraction node (sub) 302 and to sensor element (sense) 303. Charge monitoring circuit 300 also includes quantizing unit (quantizer) 305 coupled to integrator 306 and multiplexing circuit (MUX) 308. MUX 308 is coupled to two reference current sources, current ref 307a and current ref 307b. Quantizer 305 receives clock signal 310 and generates bitstream 312.

In the present embodiment, charge monitoring circuit 300 tracks an amount of charge moving through sensor element 303 (e.g., via a current through sensor element 303). Sensor element 303 may correspond to sensor element 103 in FIG. 1. When no charge passes through sensor element 303, the voltage levels at sensor input 314 and sensor output 316 are approximately equal, resulting in VCCS 301a and VCCS 301b sourcing approximately equal currents. The current from VCCS 301a flows into subtraction node 302 and current from VCCS 301b flows out of subtraction node 302. Current from subtraction node 302 to integrator 306, therefore is equal to the current from VCCS 301a minus the current out through VCCS 301b. The output of subtraction node 302 is used to charge integrator 306 depending upon the result of the subtraction. Since VCCS 301a and VCCS 301b are sourcing equal currents when there is no current through sensor element 303, no significant current is sourced or sunk from subtraction node 302, effectively adding zero charge to integrator 306.

As charge passes through sensor element 303, a voltage difference is generated between sensor input 314 and sensor output 316. When current flows from sensor input 314 to sensor output 316 (such as when battery 101 is sourcing current to load 105 in FIG. 1), the voltage level at sensor input 314 will be higher than at sensor output 316, and vice versa when current flows from output 316 to input 314 (such as when a charging current is provided to battery 101). VCCS 301a and VCCS 301b will source larger currents when higher voltages are present at sensor input 314 and sensor output 316, respectively. When charge is flowing from battery 101, therefore, VCCS 301a sources more current into subtraction node 302 that VCCS 301b sinks, resulting in a positive current that charges integrator 306. When charge is flowing into battery 101, VCCS 301b sinks more current from subtraction node 302 than VCCS 301a sources, resulting in a negative current that discharges integrator 306.

It is noted that as used herein, current is defined as flowing from a node with a higher voltage level to a node with a lower voltage level, i.e., in the opposite direction as the flow of electrons. Accordingly, as used herein, "sourcing a current" refers to current flowing from a given node to another node with a lower voltage level, and "sinking a current" refers to current flowing into the given node from another node with a higher voltage level.

Quantizer 305 samples a voltage level at integrator 306 at time intervals dependent upon clock signal 310. Clock signal 310 may be a signal of any suitable frequency and may be enabled and disabled as charge monitor circuit 300 is activated or deactivated. In various embodiments, quantizer 305 may sample the voltage level on a rising transition, a falling transition, or any transition of clock signal 310. In other embodiments, quantizer 305 may sample the voltage level after a predetermined number of clock transitions. When quantizer 305 samples the voltage level of integrator 306, the sampled voltage is compared to a reference voltage. If the voltage level of integrator 306 is higher than the reference voltage, then quantizer 305 outputs a high logic level (i.e., a bit equal to "1") on bitstream 312. Conversely, if the voltage level of integrator 306 is lower than the reference voltage, then quantizer 305 outputs a low logic level (i.e., a bit equal to "0") on bitstream 312. Bitstream 312, therefore, is comprised of a stream of bits, sent at a bit rate equal to the sampling rate of quantizer 305, in which each bit indicates the result of the comparison of the voltage level of integrator 305 to the reference voltage level. The present embodiment of bitstream 312 may correspond to a pulse density modulated (PDM) bitstream. In other embodiments, bitstream 312 may correspond to any suitable bitstream format, such as, for example, a pulse width modulated (PWM) bitstream.

As used herein, a "PDM bitstream" refers to bitstream in which an analog value is represented by a number of logic high (or alternately logic low) bits. In other words, a higher analog value corresponds to a bitstream with more logic highs than logic lows. Conversely, a lower analog value corresponds to more logic low bits than logic high. An equal number of high and low bits indicates a mid-level analog value.

It is noted that a "clock transition," as used herein (which may also be referred to as a "clock edge") refers to a clock signal changing from a first logic value to a second logic value. A clock transition may be "rising" if the clock signal goes from a low value to a high value, and "falling" if the clock signal goes from a high to a low.

Quantizer 305 also uses MUX 308 to select either current reference 307a or current reference 307b depending on the result of the comparison of the voltage level of integrator 305 to the reference voltage level, or more simply, depending on a present value of bitstream 312. Current reference 307a may be selected when bitstream 312 is low and current reference 307b may be selected when bitstream 312 is high. Unlike VCCS 301a and 301b, current references 307a and 307b may source a single current value when selected, with current reference 307a sourcing current into integrator 306 when selected and current reference 307b sinking current from integrator 306 when selected.

As previously described in regards to the present embodiment, bitstream 312 is high when the voltage level of integrator 306 is above the reference voltage, indicating that the current from VCCS 301a is greater than the current into VCCS 301b, thereby sending current from subtraction node 302 into integrator 306 and increasing the voltage level. Quantizer 305 selects current reference 307b during this high state of bitstream 312 in order to bring the voltage level of integrator 306 closer to the reference voltage. In contrast, when bitstream 312 is low, the voltage level of integrator 306 is below the reference voltage, indicating that integrator 306 has not received enough current from subtraction node 302 to charge above the reference voltage. Selecting current reference 307a to source current into integrator 306 helps charge the voltage level of integrator 306 up to the reference voltage level.

As an example of operation of charge monitoring circuit 300, if subtraction node 302 sources or sinks zero current (i.e., no charge is flowing through sensor element 303), then current reference 307a will be selected until the voltage level of integrator 306 rises above the reference voltage, at which point, current reference 307b is selected. At this point, bitstream 312 may toggle back and forth between approximately equal numbers of high and low logic levels as current references 307a and 307b switch back and forth between charging and discharging integrator 306 with approximately the same current value. When current flows from battery 101, subtraction node 302 provides a positive current into integrator 306, resulting in less current provided from current reference 307a and more current sinking through current reference 307b in order to keep the voltage level of integrator 306 near the reference voltage. As a result, bitstream 312 will output more high logic levels than low logic levels. Accordingly, charge flowing into battery 101 results in a negative current from subtraction node 302, requiring more current from current reference 307a to charge the voltage level of integrator 306 to the reference voltage level and therefore, more low logic levels output on bitstream 312.

It is noted that the block diagram of FIG. 3 is merely an example of a charge monitoring circuit. In other embodiments, a different number of components may be included. In addition, logic values and or current directions may be reversed. For example, quantizer 305 may generate a low logic value rather than a high logic value when the voltage level of integrator 306 is above the reference voltage and the selection of the current references may be reversed as a result.

Figure 4:
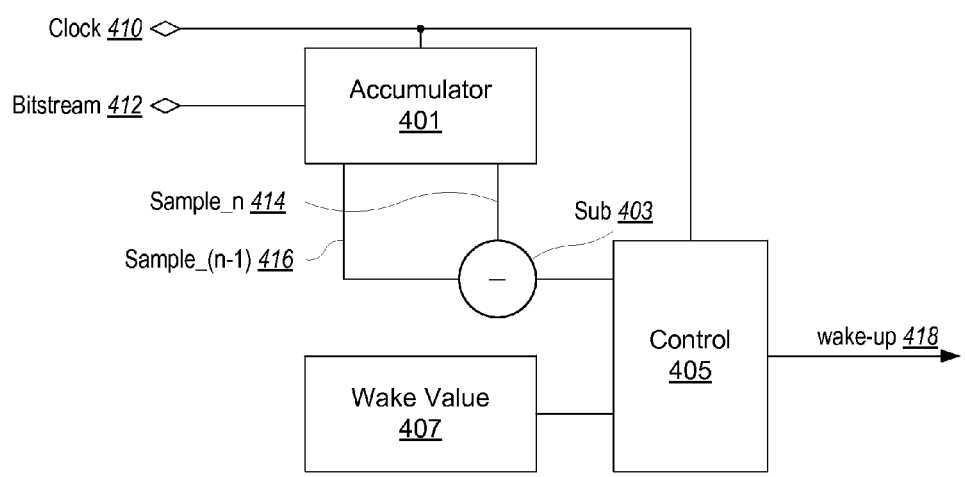
FIG. 4 illustrates an embodiment of a block diagram for a reduced power wake-up unit.

Moving now to FIG. 4, an embodiment of a block diagram for a reduced power wake-up unit is illustrated. Wake-up unit 400 may be included in battery management unit 204 in BMC 200 of FIG. 2. In the illustrated embodiment, wake-up unit 400 includes accumulator 401 coupled to subtractor circuit 403. Control logic 405 is coupled to subtractor circuit 403 as well as to wake value 407. Accumulator 401 receives clock signal 410 and bitstream 412 from a monitoring circuit such as charge monitoring circuit 300 in FIG. 3, and outputs digital values sample_n 414 and sample_(n−1) 416. Control logic 405 outputs wake-up signal 418.

The illustrated embodiment of wake-up unit 400 receives bitstream 412 and determines an accumulated number of coulombs that have passed through sensor element 303 over a period of time (i.e., an average current for the time period). Wake-up unit 400 asserts an indication, e.g., wake-up signal 418, if the accumulated coulombs increase by greater than a threshold amount within a predetermined time period. To perform this function, accumulator 401 receives clock signal 410 and bitstream 412. Clock signal 410 may correspond to clock signal 310 and bitstream 412 may correspond to bitstream 312, both signals from FIG. 3. Accumulator 401 reads a bit from bitstream 412 dependent on an active transition of clock signal 410, e.g., corresponding to a sample by quantizer 305 in charge monitoring circuit 300. A count value in accumulator 401 is incremented for each bit received with a "1" value and decremented for each bit received with a "0" value. Accumulator 401 may keep a running count of the accumulated coulombs being monitored and this running count may be used by other functional blocks of BMC 200. At a predetermined time interval, accumulator 401 reads the present count value and outputs this value along with a buffered count value from the last time interval. Accumulator 401 then shifts the present count value into the buffer to be used as the last count value at the next time interval. In some embodiments, the predetermined time interval may be selected as a multiple of the sample rate of quantizer 305.

Subtractor circuit 403 receives each of the present and last count values and subtracts the last count value from the present count value. The difference is sent to control logic 405. A threshold value is read from wake value 407. Wake value 407 may be one or more registers or memory locations used to store the predetermined threshold value. The threshold value may be programmable in some embodiments or a fixed value in other embodiments. Control logic 405 compares the difference to the threshold value and asserts wake-up signal 418 if the difference is greater than the threshold value. Using a difference between successive accumulator 401 values, rather than simply using the present count value, may result in avoiding offset currents that could otherwise cause a false indication of increased activity. Offset currents may drift higher or lower depending on various factors. By monitoring successive count values, offset currents that rise more slowly may not cause the difference in count values to surpass the threshold value, whereas, increased system activity may cause a more sudden increase in count values that does surpass the threshold value. Wake-up signal 418 may be an active high signal or an active low signal. In some embodiments, wake-up signal 418 may be coupled to interrupt logic within BMC 200 and may be used to wake or activate other functional blocks from a reduced power mode, such as processor 201, for example.

It is noted that wake-up unit 400 of FIG. 4 merely illustrates an example embodiment. Only the components necessary to demonstrate the disclosed concepts are shown. In other embodiments, additional functional blocks may be included.

Figure 5:
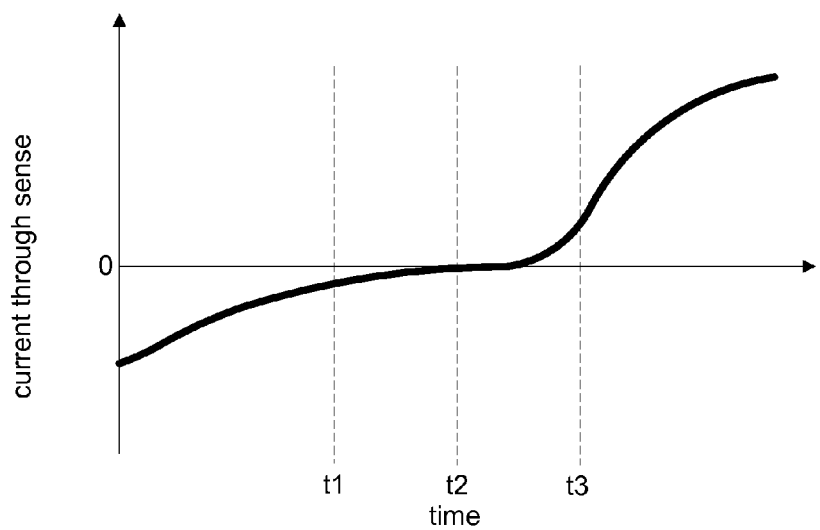
FIG. 5 shows a chart of an example of current through a current sensor over time for an embodiment of a computing system.

Turning now to FIG. 5, a chart of an example of current through a current sensor over time for an embodiment of a computing system is illustrated. The chart of FIG. 5 shows current flow through a current sensor, such as, e.g., sensor element 303, versus time. Three points on the time axis are indicated, time t1, t2, and t3, which may correspond to the time intervals in which accumulator 401 reads the present count value as described in regards to FIG. 4.

Up to and including time t1, a negative current has been flowing through sensor element 303, i.e., a charging current may be flowing to a battery, such as battery 101 in FIG. 1. By time t2, the current through sensor element reaches zero, which, in some embodiments, may indicate that battery 101 has reached a fully charged or near fully charged state. System 100 may be in an inactive state and, therefore, portions of BMC 200 may be placed in a reduced current mode, including, for example, processor 201. Charge monitoring circuit 300, however, continues to monitor the current through sensor element 303. Between time t2 and time t3, the current through sensor element 303 begins to increase, indicating that system 100 may be exiting an inactive state and transitioning to an active state.

Figure 6:
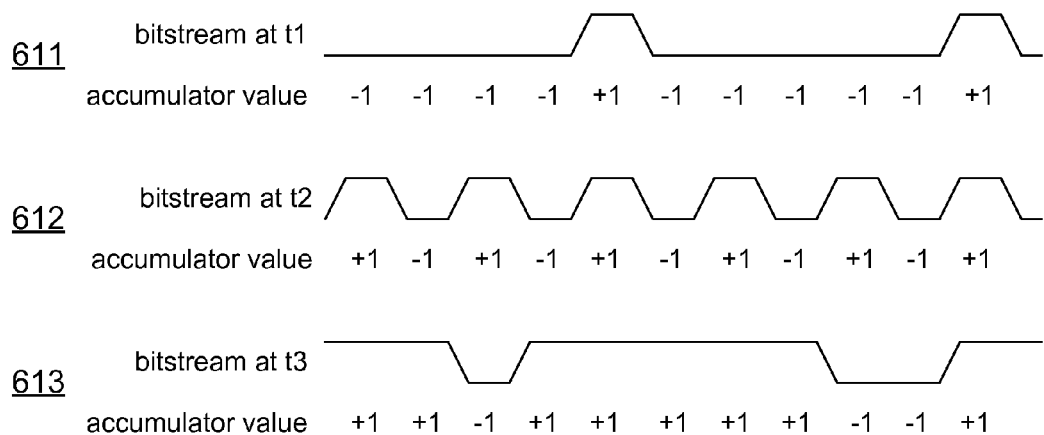
FIG. 6 illustrates timing diagrams associated with the chart of FIG. 5.

FIG. 6 illustrates timing diagrams for bitstream 412 (i.e., 312) corresponding to times t1, t2, and t3 in FIG. 5. Corresponding actions by accumulator 401 in response to each received bit of bitstream 412 are also shown in FIG. 6. Referring jointly to FIG. 5 and FIG. 6, the operation of example embodiments of charge monitoring circuit 300 and wake-up unit 400 are demonstrated.

As a result of the negative current flowing up to and including time t1, bitstream 412 includes more logic low values versus logic high values, as indicated by timing diagram 611. Accumulator 401 decrements its count value for each corresponding bit with a logic low value and increments the count value for each bit with a logic high value, resulting in a decreasing count value. Accumulator 401 reads and buffers a present count value.

Since the current at time t2 is approximately zero, timing diagram 612 shows that bitstream 412 includes a mostly equal number of high and low logic levels. The count value in accumulator 401, therefore, remains approximately constant around this time. Accumulator 401 reads the present count value at t2 and sends this present count value along with the count value from t1 to subtractor circuit 403. Since the current between times t1 and t2 has been mostly negative, the difference between the t2 count value and the t1 count value is negative. Accumulator 401 buffers the t2 count value in place of the t1 count value after sending the values to subtractor circuit 403. Control logic 405 compares the difference to the predetermined threshold value stored in wake value 407, which may result in the difference being below the threshold value.

The increase in current between times t2 and t3 results in bitstream 412 including more logic high values and fewer logic low values, as illustrated in timing diagram 613. Accordingly, accumulator 401 increments the count value more than decrementing it, resulting in a rising count value. At time t3, accumulator 401 reads the count value and sends it to subtractor circuit 403 along with the t2 count value. The t2 count value is subtracted from the t3 count value and the difference is sent to control logic 405. Since the current has been mostly positive since time t2, the difference is positive. Control logic 405 may determine that the difference is larger than the threshold value and as a result assert wake-up signal 418.

It is noted that the chart of FIG. 5 and timing diagram of FIG. 6 are merely examples for an embodiment of charge monitoring circuit 300 and wake-up unit 400. The chart of FIG. 5 is simplified to demonstrate an example of currents that could be monitored by the disclosed embodiments. In other embodiments, a chart of current versus time may appear significantly different. The timing diagrams of FIG. 6 are not intended to indicate exact values associated with FIG. 5.

Figure 7:
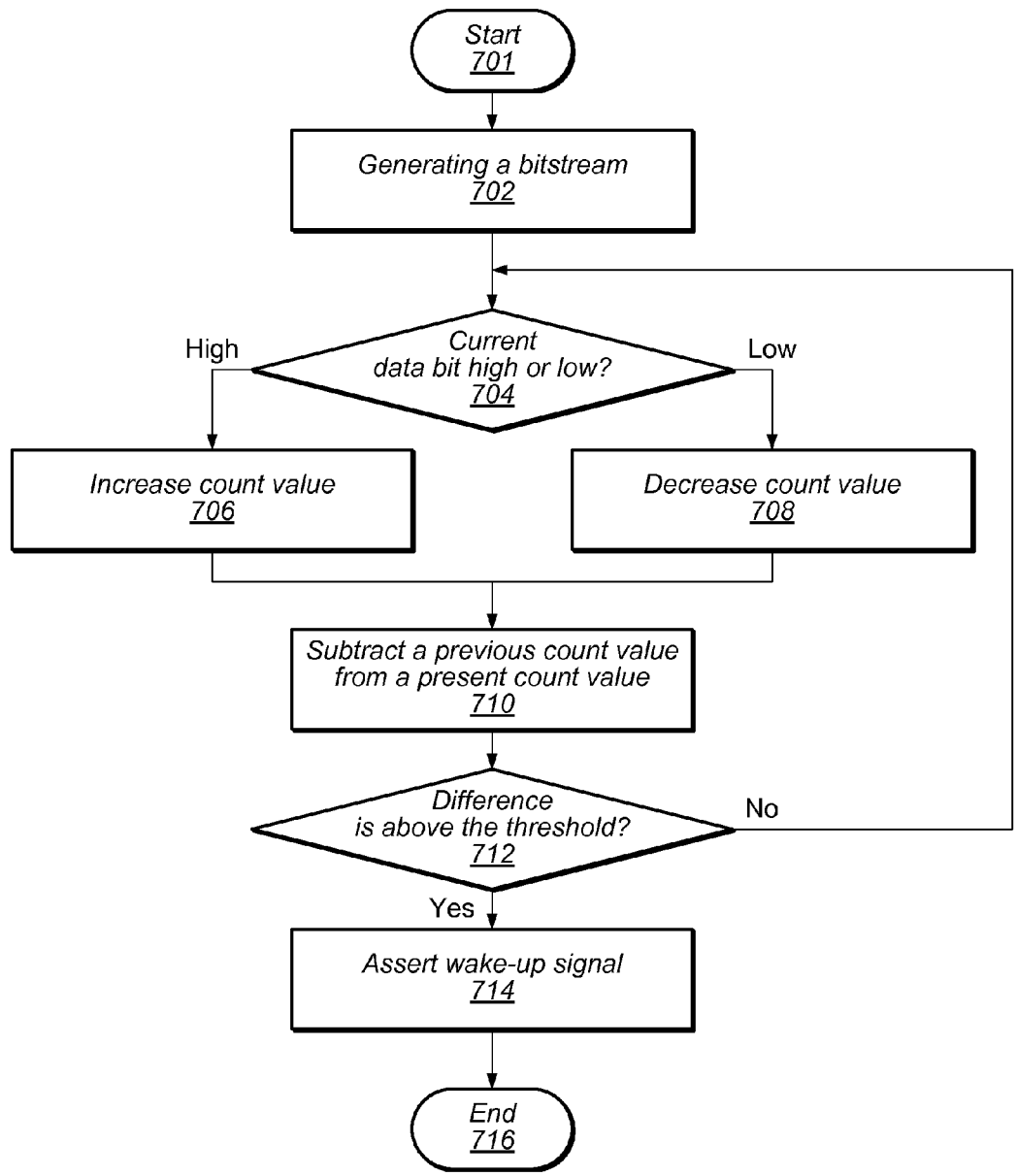
FIG. 7 shows a flow diagram illustrating an embodiment of a method for determining to assert a wake-up signal in response to a level of accumulated coulombs.

Moving to FIG. 7, a flow diagram illustrating an embodiment of a method for determining to assert a wake-up signal in response to a level of accumulated coulombs is shown. The method may be applied to a battery monitoring circuit, such as, for example, BMC 102 in FIG. 1 and more specifically, to charge monitoring circuit 300 in FIG. 3 and wake-up unit 400 in FIG. 4. Referring collectively to system 100 of FIG. 1, charge monitoring circuit 300 in FIG. 3, wake-up unit 400 in FIG. 4, and the flow diagram in FIG. 7, the method begins in block 701.

In the present embodiment, charge monitoring circuit 300 generates a bitstream (block 702). The value of each bit of the bitstream is determined dependent upon measurements of a current flowing through sensor element 303. Higher current flowing through sensor element 303 may produce more bits with a high logic value and lower current may result in more bits with a low logic value. In other embodiments, the opposite may be true. The bitstream is sent from charge monitoring circuit 300 to wake-up unit 400 (e.g., bitstream 312 in FIG. 3 and bitstream 412 in FIG. 4). The length of each bit in the bitstream may be determined by a sampling rate of charge monitoring circuit 300.

Further operations of the method may depend on the value of a current bit (block 704). Wake-up unit 400 receives the bitstream from charge monitoring circuit 300. Each bit of the bitstream may be received one at a time. Dependent on the value of each bit, accumulator 401 may increase or decrease a count value. If the bit value is low, the method may proceed to block 708. Otherwise, the method moves to block 706.

Accumulator 401 increments the count value in response to receiving a bit with a logic high value (block 706). The high bit value may indicate that an amount of charge collected by integrator 306 has risen such that a voltage level across terminals if integrator 306 is higher than a reference voltage level. A greater number of high logic levels in the bitstream may correspond to a positive flowing current. Accumulator 401 includes a counter circuit (or simply "counter") that is incremented in response to receiving a logic high bit.

If the received bit value is low, then accumulator 401 decrements the count value (block 708). The low value of the bit may indicate that the amount of charge collected by integrator 306 has not risen enough to cause the voltage level across the terminals of integrator 306 to be greater than the reference voltage. A greater number of low bit values may correspond to a negative flowing current, i.e., current flowing towards battery 101 (e.g., a recharging current) instead of from battery 101. Accumulator 401 decrements the counter as a result of receiving a bit with a low value.

Wake-up unit 400 may subtract a previous value of the counter from a current value of the counter (block 710). Wake-up unit 400 periodically reads a present value of the counter at a predetermined time interval. In addition, wake-up unit 400 saves a last read counter value in a buffer. After reading the present counter value, wake-up unit subtracts the last read counter value from the presently read counter value and the difference is sent from subtractor circuit 403 to control logic 405. After sending the present value and previous value of the counter to subtractor circuit 403, accumulator 401 buffers the present counter value in place of the previous value.

Further actions of the method may depend on the difference between the present counter value and the previous counter value (block 712). In the illustrated embodiment, control logic 405 compares the difference between the present and previous counter values to a predetermined threshold value. The predetermined threshold value and the predetermined time interval for reading the counter value may be fixed during the manufacturing or testing of a computing device or may be programmable by a host processor in the device. In some embodiments, the predetermined threshold value, the predetermined time interval, or both values may be set dynamically dependent on recent values of the difference. If the difference is not above the threshold value, then the method returns to block 704 to evaluate a next bit in the bitstream. Otherwise, the method moves to block 714 to assert a wake-up signal.

After determining that the difference is greater than the threshold value, a wake-up signal is asserted to bring some or all of the functional units in BMC 102 into an active mode (block 714). An increase in the difference between successive readings of the counter value may indicate that load 105 in FIG. 5 is beginning to consume more current from battery 101. For example, if load 105 is part of a computing device, then an increase in the current flowing through sensing element 103 may be an indication that the computing device is entering an active mode and that BMC 102 needs to perform more tasks related to battery management, require more functional units in BMC 102 to be active. The wake-up signal may be coupled to interrupt circuitry in BMC 102 which may cause a processor in BMC 102 to wake from a reduced power mode into an active mode. The method may end in block 716.

It is noted that the method illustrated in FIG. 7 is merely an example embodiment. Variations on this method are possible and contemplated. For example, some operations may be performed in a different sequence, and/or additional operations may be included.

Figure 8:
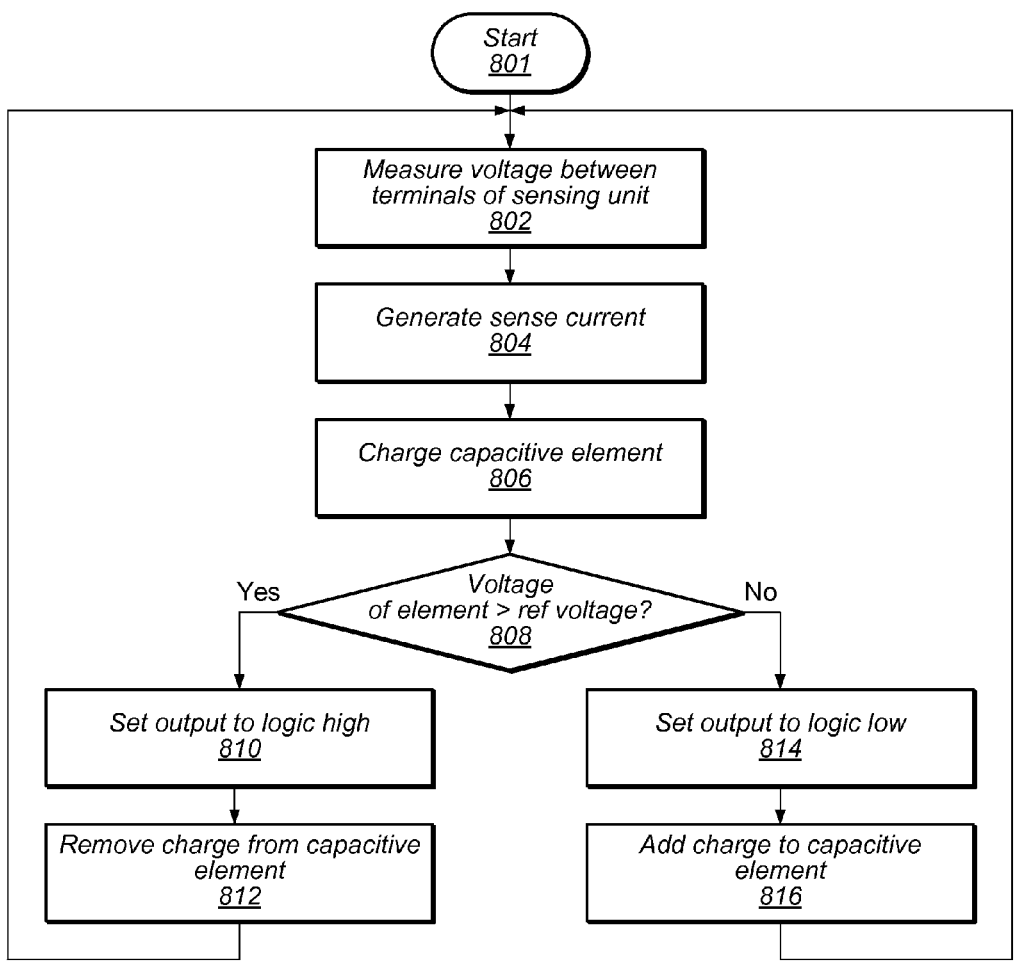
FIG. 8 illustrates a flow diagram for an embodiment of a method for measuring charge flowing from a power source.

Turning now to FIG. 8, a flowchart illustrating an embodiment of a method for measuring charge flowing from a power source is presented. The method may correspond to block 702 of the method of FIG. 7, and may be applied to charge monitoring circuit 300 in FIG. 3. Referring collectively to charge monitoring circuit 300 of FIG. 3, and the flowchart in FIG. 8, the method begins in block 801.

A voltage is measured across terminals of sensor element 303 (block 802). In the present embodiment, charge monitoring circuit 300 measures two voltages, one at sensor input 314 and one at sensor output 316. In various other embodiments, a single voltage across the input and output terminals may be measured, or more than two voltages may be measured.

Charge monitoring circuit 300 generates a sense current dependent upon the measured voltages (block 804). Each of the measured voltages may be coupled to a control terminal of a respective voltage-controlled current source. The voltage level of sensor input 314 controls a current output of VCCS 301*a*, and the voltage level of sensor output 316 similarly controls a current output of VCCS 301*b*. In the illustrated embodiment, a higher voltage level on the control terminal of each VCCS 301*a-b* results in a higher current output of each VCCS 301*a-b*. The current from VCCS 301*a* flows into subtraction node 302 while the current from VCCS 301*b* flows out of subtraction node 302. Accordingly, the current from VCCS 301*b* is subtracted from the current of VCCS 301*a* at subtraction node 302.

A capacitive element in integrator 306 is charged by the sense current (block 806). When the voltage level of sensor input 314 is higher than the voltage level of sensor output 316 (corresponding to a flow of current from battery 101 in FIG. 1), a positive sense current from subtraction node 302 flows to integrator 306. Conversely, when the voltage level of sensor input 314 is lower than the voltage level of sensor output 316 (corresponding to a flow of current to battery 101), a negative sense current from subtraction node 302 flows from integrator 306. When the voltage levels of sensor input 314 and sensor output 316 are equal, the sense current to/from subtraction node 302 is approximately zero. Current flowing from battery 101 through sensor element 303 results in the sense current charging the capacitive element in integrator 306, while current flowing back towards battery 101 results in the sense current discharging the capacitive element. The charging and/or discharging of integrator 306 results in a voltage being generated across terminals of the capacitive element.

Further actions of the method may depend on a voltage level across the terminals of the capacitive element (block 808). Quantizer 305 periodically samples the voltage level of integrator 306 at a predetermined time interval. The rate at which quantizer 305 samples the voltage level determines a bit rate for bitstream 312. In the present embodiment, each voltage level sample corresponds to one bit of bitstream 312. In other embodiments, more than one sample may be made for each bit. For each sample, the voltage level of the capacitive element of integrator 306 is compared to a reference voltage in quantizer 305. If the voltage level of the reference voltage is higher, then the method moves to block 814 to set an output bit low. Otherwise, the method sets the output bit high in block 810.

A next bit to be output is set high (block 810). If the voltage level of integrator 306 is greater than the reference voltage level, then quantizer 305 sets the next bit of bitstream 312 to a high logic level. Bitstream 312 is sent to wake-up unit 400 as described above in regards to FIG. 7.

Charge is removed from the capacitive element in integrator 306 (block 812). In response to a bit being set high, quantizer 305 sets MUX 308 to couple current reference 307*b* to integrator 306. Current reference 307*b* sinks current from subtraction node 302 and integrator 306, thereby removing charge from the capacitive element. The charge is removed to keep a voltage level of the capacitive element near the reference voltage level. Depending on the amount of sense current versus the reference current, the voltage level of the capacitive element may or may not fall below the reference voltage level by the next sampling time of quantizer 305. The method returns to block 802 to repeat the process.

If the voltage level of integrator 306 is less than the reference voltage level in block 808, then the next bit to be output is set low (block 814). Quantizer 305 sets the next bit of bitstream 312 to a logic low level. Bitstream 312 is sent to wake-up unit 400 as described above.

Quantizer 305 adds charge to the capacitive element (block 816). In response to the bit value being set low, quantizer 305 uses MUX 308 to couple current reference 307*a* to integrator 306. Current from current reference 307*a* is sourced to subtraction node 302 and integrator 306, thereby adding charge to the capacitive element. The increase in charge may help to keep the voltage level across integrator 306 close to the reference voltage. The amount of charge added to the capacitive element is dependent upon the amount of sense current relative to the amount of reference current. For example, if the sense current is a large negative amount, then most of the current from current reference 307*a* may flow to VCCS 301*b* and little to no charge may be added to integrator 306 and the capacitive element's voltage level may rise slowly or remain at the present level. However, if the sense current is near zero or a positive current, then most or all of the current from current reference 307*a* may flow to integrator 306, thereby charging the capacitive element and raising the voltage level quickly. The method may return block 802 to repeat the process.

It is noted that the method illustrated in FIG. 8 is an example for demonstrating the disclosed concepts. In various embodiments, some operations may be performed in a different sequence, and/or additional operations may be included. Although operations are illustrated as occurring in series, in some embodiments, the performance of some or all of the operations may overlap or occur in parallel.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   an energy monitoring circuit configured to generate a bitstream, wherein one or more values of the bitstream are determined based on an amount of charge passing through a sensing unit during an interval of time; and
   a control unit configured to:
      receive the bitstream from the energy monitoring circuit;
      modify a count value in response to a determined state of each bit of the bitstream;
      read a first value of the count value at a first time;
      read a second value of the count value at a second time, wherein the second time occurs after a predetermined amount of time has elapsed since the first time; and
      assert a wake-up signal in response to a determination that a difference between the first value and the second value is greater than a predetermined threshold value.

2. The apparatus of claim 1, wherein to generate the bitstream, the energy monitoring circuit is further configured to:
   measure a voltage level between a first terminal of the sensing unit and a second terminal of the sensing unit; and
   generate a sense current, wherein a value of the sense current is dependent upon the voltage level.

3. The apparatus of claim 2, wherein the energy monitoring circuit is further configured to charge a capacitive element dependent upon the sense current and one or more reference currents.

4. The apparatus of claim 3, wherein to generate the bitstream, the energy monitoring circuit is further configured to compare a voltage level between terminals of the capacitive element to a reference voltage level.

5. The apparatus of claim 1, wherein to adjust the count value, the control unit is further configured to increment the count value in response to a determination that a given bit of the bitstream is in a logic high state.

6. The apparatus of claim 5, wherein to modify the count value, the control unit is further configured to decrement the count value in response to a determination that the given bit of the bitstream is in a logic low state.

7. The apparatus of claim 1, wherein the bitstream corresponds to a pulse density modulated bitstream.

8. A method, comprising:
   generating a bitstream, wherein one or more values of the bitstream are determined based on an amount of charge passing through a sensing unit during an interval of time;
   modifying a count value in response to a determined state of each bit of the bitstream;
   reading a first value of the count value at a first time;
   reading a second value of the count value at a second time, wherein the second time occurs after a predetermined amount of time has elapsed since the first time; and
   asserting a wake-up signal in response to a determination that a difference between the first value and the second value is greater than a predetermined threshold value.

9. The method of claim 8, wherein generating the bitstream comprises:
   measuring a voltage level between a first terminal of the sensing unit and a second terminal of the sensing unit; and
   generating a sense current, wherein a value of the sense current is dependent upon the voltage level.

10. The method of claim 9, further comprising charging a capacitive element dependent upon the sense current.

11. The method of claim 10, wherein generating the bitstream further comprises comparing a voltage level between terminals of the capacitive element to a reference voltage level.

12. The method of claim 8, wherein modifying the count value comprises incrementing the count value in response to a determination that a given bit of the bitstream is in a logic high state.

13. The method of claim 12, wherein modifying the count value further comprises decrementing the count value in response to a determination that the given bit of the bitstream is in a logic low state.

14. The method of claim 8, further comprising adjusting a value for the predetermined threshold value.

15. A system comprising:
   a processor;
   an energy sensor coupled between a power source and a load; and
   a wake-up circuit configured to:
      generate a bitstream, wherein one or more values of the bitstream are determined based on an amount of charge passing through a sensing unit during an interval of time;
      modify a count value in response to a determined state of each bit of the bitstream;
      read a first value of the count value at a first time;
      read a second value of the count value at a second time, wherein the second time occurs after a predetermined amount of time has elapsed since the first time; and
      assert a wake-up signal in response to a determination that a difference between the first value and the second value is greater than a predetermined threshold value.

16. The system of claim 15, wherein to generate the bitstream, the wake-up circuit is further configured to:
   measure a voltage level across the energy sensor; and
   generate a sense current, wherein a value of the sense current is dependent upon the voltage level.

17. The system of claim 16, wherein the wake-up circuit is further configured to charge a capacitive element dependent upon the sense current.

18. The system of claim 17, wherein to generate the bitstream, the wake-up circuit is further configured to compare a voltage level between terminals of the capacitive element to a reference voltage level.

19. The system of claim 15, wherein to modify the count value, the wake-up circuit is further configured to increase the count value in response to a determination that a given bit of the bitstream is in a logic high state.

20. The system of claim 19, wherein to modify the count value, the wake-up circuit is further configured to decrease the count value in response to a determination that the given bit of the bitstream is in a logic low state.

* * * * *